US006496083B1

(12) United States Patent
Kushitani et al.

(10) Patent No.: US 6,496,083 B1
(45) Date of Patent: Dec. 17, 2002

(54) DIODE COMPENSATION CIRCUIT INCLUDING TWO SERIES AND ONE PARALLEL RESONANCE POINTS

(75) Inventors: Hiroshi Kushitani, Izumisano (JP); Naoki Yuda, Hirakata (JP); Hiroshi Takahashi, Neyagawa (JP); Makoto Fujikawa, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/242,139

(22) PCT Filed: Jun. 2, 1998

(86) PCT No.: PCT/JP98/02428

§ 371 (c)(1), (2), (4) Date: Feb. 3, 1999

(87) PCT Pub. No.: WO98/56060

PCT Pub. Date: Dec. 10, 1998

(30) Foreign Application Priority Data

Jun. 3, 1997 (JP) .............................................. 9-144863
May 14, 1998 (JP) .............................................. 10-131638

(51) Int. Cl.[7] .............................................. H03H 7/46
(52) U.S. Cl. .......................... 333/103; 333/132; 455/83
(58) Field of Search ................................ 333/103, 104, 333/132; 455/78, 82, 83

(56) References Cited

U.S. PATENT DOCUMENTS 5,748,054 A * 5/1998 Tonegawa et al. .......... 333/104
6,011,450 A * 1/2000 Miya .......................... 333/103

FOREIGN PATENT DOCUMENTS

| | | |
|---|---|---|
| JP | S54-183246 | 6/1978 |
| JP | S60-114402 | 2/1985 |
| JP | 63-13418 | 1/1988 |
| JP | 2-108301 | 4/1990 |
| JP | 5-55803 | 3/1993 |
| JP | 5-90935 | 4/1993 |
| JP | 7-74604 | 3/1995 |
| JP | 7-321692 | 8/1995 |
| JP | 8-32303 | 2/1996 |
| JP | 09139601 A | 5/1997 |

OTHER PUBLICATIONS

Japanese language search report for Int'l Applin No. PCT/JP98/02428 dated Sep. 8, 1998.

* cited by examiner

*Primary Examiner*—Justin P. Bettendorf
(74) *Attorney, Agent, or Firm*—RatnerPrestia

(57) ABSTRACT

The present invention aims to realize, in regard to a high frequency switch used for a mobile communication apparatus such as a portable telephone or the like, a dual band switch having simple structure and changeable to ON and OFF states in two bands. For realizing the aim, the present invention provide a dual band switch comprising a series circuit of a PIN diode (101) and its compensation circuit (102), and, the compensation circuit (102) is formed with a circuit having at least two series resonance points and one parallel resonance point. The above structure allows the impedance of the compensation circuit, which is capacitive in low frequency close to a direct current, to be inductive after undergoing the first series resonance point, whereby the parasitic capacity of the diode is canceled in the first band, and also to be inductive again after undergoing the parallel resonance point and the following series resonance point, whereby the parasitic capacity of the PIN diode is canceled in the second band.

14 Claims, 11 Drawing Sheets

| | Real number component | Imaginary number component | Frequency |
|---|---|---|---|
| 1: | 14.797Ω | 128.81Ω | 890MHz |
| 2: | 70.906Ω | 265.94Ω | 960MHz |
| 3: | 75.523Ω | 249.34Ω | 1.71GHz |
| 4: | 342.27Ω | -482.77Ω | 1.88GHz |

Start 500MHz
∞Stop 2.5GHz

Transmission characteristics from first terminal to common terminal

Transmission characteristics from common terminal to second terminal

DIODE COMPENSATION CIRCUIT INCLUDING TWO SERIES AND ONE PARALLEL RESONANCE POINTS

This application is a U.S. National Phase Application of PCT International Application PCT/JP98/02428.

FIELD OF THE INVENTION

The present invention relates to a dual band switch, a dual band antenna duplexer and a dual band mobile communication apparatus using the same, used mainly for a mobile communication device such as a portable telephone or the like.

BACKGROUND OF THE INVENTION

A popular convention high frequency switch is disclosed in the non-examined Japanese Patent Application Publication No. H07-321692. A conventional switch is shown in FIG. 13. The switch of FIG. 13 comprises a circuit connecting in parallel PIN diode 1001 and compensation circuit 1002. Compensation circuit 1002 may be formed with a series connection of capacitor 1003 and inductor 1004. Compensation circuit 1002 may be used for turning off the switch circuit when PIN diode 1001 is in an inactive state. Therefore, compensation circuit 1002 may be set so that inductor 1004 cancels the parasitic capacitance of PIN diode 1001 in an inactive state, and may help create parallel resonance at a desired band. Capacitor 1003 may be referred to as a DC cut element for interrupting the direct current route of the compensation circuit when PIN diode 1001 becomes active and the switch circuit is turned on. As a result, compensation circuit 1002 may be adjusted to have an impedance which is capacitive in a frequency range close to a direct current and inductive in a desired band, as well as to have one series resonance point in-between.

In recent years, the rapid increase of users of mobile communication technology has been observed. Mobile communication technology often entails obtaining a required number of telephonic communication channels. Experiments in using two band systems by one communication apparatus may therefore often be performed. For two band systems, a switch that works in two different bands may be required. A conventional high frequency switch, however, may be able to obtain a sufficient OFF state in only one band when a PIN diode is inactive. Therefore, to realize two band systems, two high frequency switches suitable for respective bands may be needed. The use of two high frequency switches may result in a large and complicated circuit, as well as a relatively expensive one.

The present invention addresses the aforementioned and other problems and aims to provide a dual band switch with which sufficient OFF states may be obtained in two different bands.

SUMMARY OF THE INVENTION

A circuit in accordance with the present invention comprises a parallel circuit including a diode and a compensation circuit. The compensation circuit is formed with a circuit having at least two series resonance points and one parallel resonance point.

A circuit in accordance with the present invention allows the impedance of the compensation circuit, which is capacitive in low frequency close to a direct current, to become inductive after the first series resonance point, whereby a parasitic capacitance of the diode is canceled in a first band. Further, the impedance of the compensation circuit becomes inductive again after the parallel resonance point and after the following series resonance point, whereby a parasitic capacitance of the diode is canceled in a second band. A dual band switch which assures sufficient OFF states in two different bands may thus be obtained with a relatively simple structure.

DESCRIPTION OF THE PREFERRED EMBODIMENTS

In the following, explanations of exemplary embodiments of the present invention are described referring to FIG. 1 through FIGS. 12A and 12B.

First Exemplary Embodiment

Figure 1:
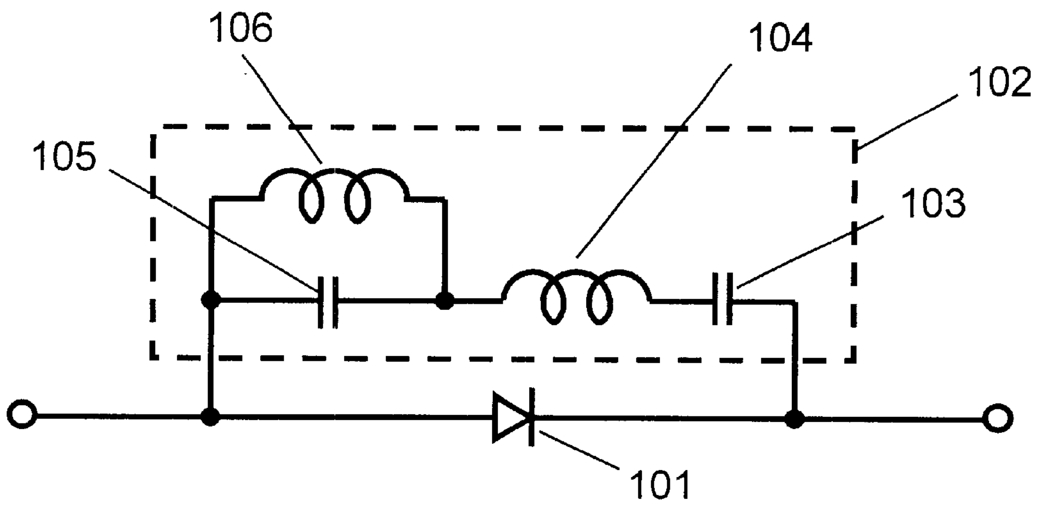
FIG. 1 shows the circuit of a dual band switch in a first exemplary embodiment of the present invention.

FIG. 1 shows a dual band switch in a first exemplary embodiment of the present invention. In FIG. 1, the dual band switch comprises a circuit connecting in parallel PIN diode 101 and its compensation circuit 102. Compensation circuit 102 includes a circuit which serially connects a serial resonance circuit, formed with first capacitor 103 and first inductor 104, with a parallel resonance circuit formed with second capacitor 105 and second inductor 106.

The operation of the dual band switch having the arrangement shown in FIG. 1 is described below.

The impedance of compensation circuit 102 is capacitive at low frequency (close to a direct current), at which the effect of capacitor 103 is dominant. Then, after a series resonance point, created by the combined impedance of first inductor 104, second capacitor 105 and second inductor 106, and first capacitor 103, the impedance of compensation circuit 102 becomes inductive. Hence, a parasitic capacitance of PIN diode 101 in an inactive state may be canceled in a, first band, and accordingly the switch may attain a sufficient OFF state in the first band.

Then, after a parallel resonance point, created by the second capacitor 105 and the second inductor 106, the impedance of compensation circuit 102 may become capacitive again. Further, after the series resonance point created by the combined impedance of first capacitor 103 and first inductor 104, and the parallel resonance circuit, the impedance of compensation circuit 102 becomes inductive again. Hence, a parasitic capacity of PIN diode 101 in an inactive state may be canceled in a second band. and accordingly the switch may attain a sufficient OFF state in the second band.

When PIN diode 101 becomes active and the switch is turned on, first capacitor 103 functions as a so called direct current cut element for interrupting the direct current route of compensation circuit 102.

Figure 2:
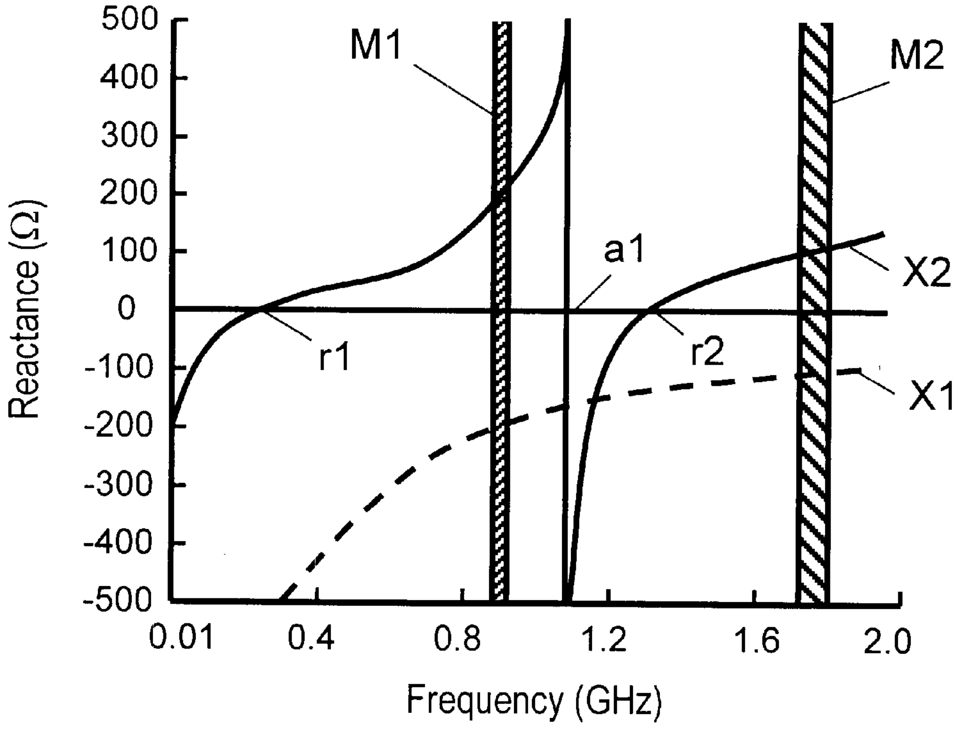
FIG. 2 shows frequency characteristics of reactance at an OFF state of the dual band switch.

FIG. 2 shows reactance characteristics at an OFF state of the dual band switch of this exemplary embodiment of the present invention. In FIG. 2 X1 represents reactance by parasitic capacitance of PIN diode 101 in an inactive state, and X2 represents reactance of compensation circuit 102. As parasitic capacitance is canceled by a parallel connection of circuits with reactances which are equal in magnitude and opposite in sign, the parasitic capacitance may be substantially canceled in first band M1 and second band M2 by connecting in parallel compensation circuit 102, having two series resonance points r1, r2 and one parallel resonance point a1, with diode 101.

Figure 3:
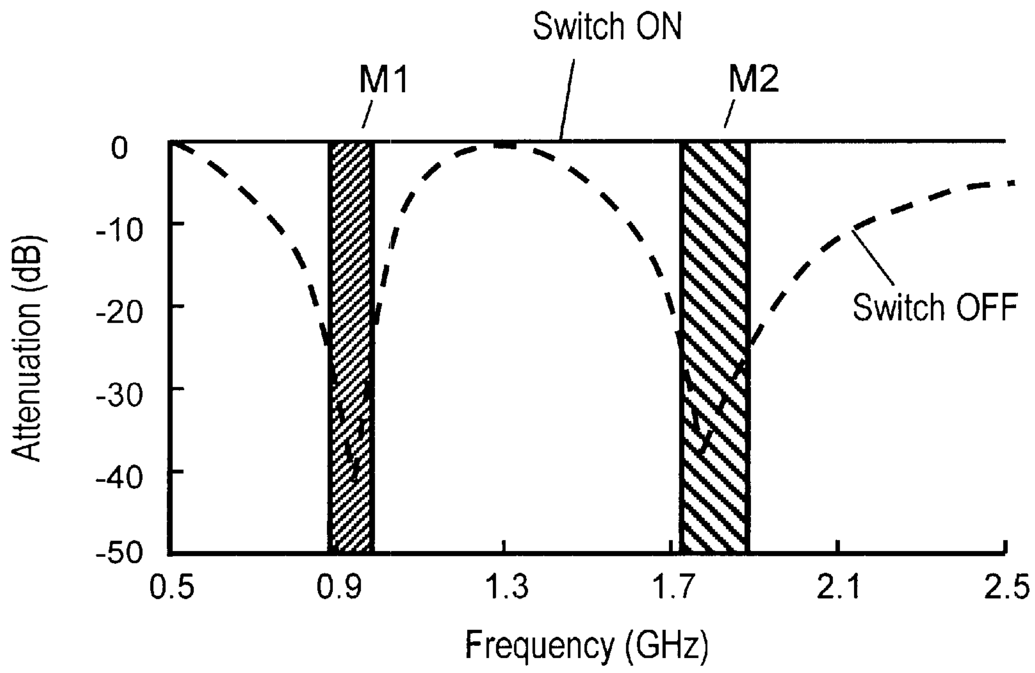
FIG. 3 shows transmission characteristics of the dual band switch.

The transmission characteristics of the dual band switch of FIG. 1 are shown in FIG. 3. As shown in FIG. 3, insertion loss at switch ON is less than 0.5 dB in all bands, and, at switch OFF, an isolation of more than 25 dB is obtained in the first band M1 (890–960 MHz) and second band (1710–1880 MHz).

The arrangement discussed in the foregoing enables the dual band switch of this exemplary embodiment to attain sufficient OFF states in two different bands.

Figure 4:
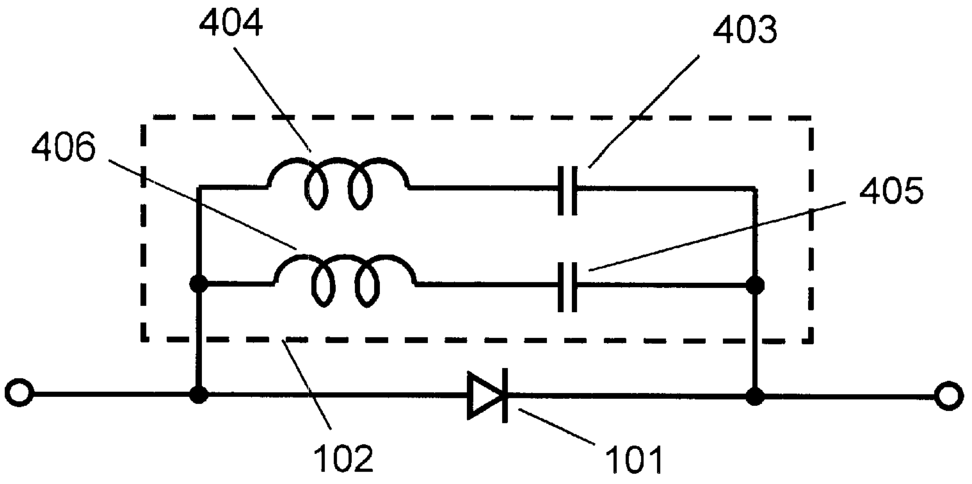
FIG. 4 shows a circuit diagram of a variation of the dual band switch of the first exemplary embodiment.

Compensation circuit 102 of FIG. 1 is formed by a series circuit of a series resonance circuit and a parallel resonance circuit. Alternatively, a compensation circuit may also be formed by a circuit connecting in parallel two series resonance circuits as shown in FIG. 4. Namely, two series resonance circuits are respectively formed with first capacitor 403 and first inductor 404, and with second capacitor 405 and second inductor 406. These two series circuits may then be connected in parallel to form compensation circuit 102. This circuit arrangement has a characteristic which is capacitive at low frequency (close to direct current) having two series resonance points and one parallel resonance point.

Both the compensation circuit 102 of FIG. 4 and the compensation circuit 102 of FIG. 1 have substantially the same 5 impedance characteristics as shown in FIG. 2, and substantially the same transmission characteristics as shown in FIG. 3. Therefore, using the compensation circuit of FIG. 4, a dual band switch that attains a sufficient OFF state in two bands M1, M2 may be realized.

Using a switch in accordance with this exemplary embodiment, a bias circuit, comprising a resistor, an inductor and a bypass capacitor, may be needed for putting the PIN diode into an active state. Further, a direct current cut capacitor may be used at each terminal for preventing a direct current. The present invention, however, is not restricted by the details of the various possible values and the structure of these additional components.

In a portable telephone terminal in which two frequency bands are used, for example, the structure of a high frequency switch circuit of the terminal may be simplified by using a dual band switch in accordance with an embodiment of the present invention. The terminal may thus be reduced both in size and weight.

Second Exemplary Embodiment

Figure 5:
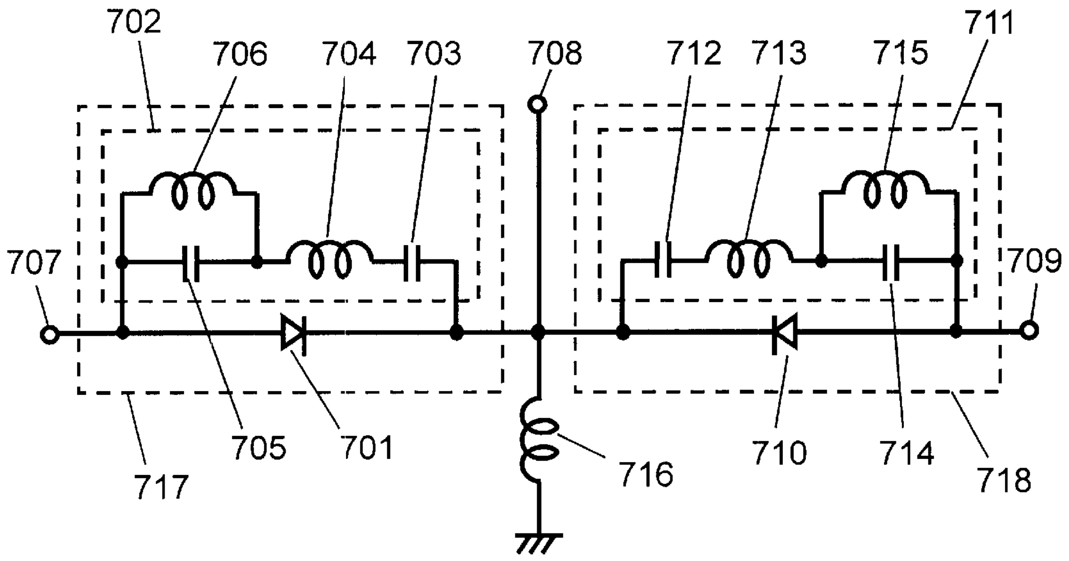
FIG. 5 shows a circuit diagram of a dual band switch in a second exemplary embodiment of the present invention.

FIG. 5 shows a dual band switch in accordance with a second exemplary embodiment of the present invention. In FIG. 5, between first terminal 707 and common terminal 708, first PIN diode 701 may be connected, and between second terminal 709 and common terminal 708, second PIN diode 710 may be connected. The cathodes of PIN diodes 701 and 710 may be connected to common terminal 708. Also, a series resonance circuit formed with first capacitor 703 and first inductor 704, and a parallel resonance circuit formed with second capacitor 705 and second inductor 706 may be connected in series forming first compensation circuit 702. First compensation circuit 702 may then be connected in parallel with first PIN diode 701 forming first switch 717. Furthermore, a series resonance circuit formed with third capacitor 712 and third inductor 713, and a parallel resonance circuit formed with fourth capacitor 714 and fourth inductor 715 may be connected in series forming second compensation circuit 711. Second compensation circuit 711 may then be connected in parallel with second PIN diode 710 forming second switch 718. Choke coil 716 may be connected between common terminal 708 and ground.

The operation of the dual band switch with the aforementioned arrangement is described below. Independently, the operation of first switch 717 and of second switch 718 are substantially the same. Each of first switch 717 and second switch 718 independently operate as the dual band switch of FIG. 1.

When first switch 717 is turned on by applying a direct current, as second PIN diode 710 substantially prevents the flow of current and as third capacitor 712 of second compensation circuit 711 cuts the direct current component substantially, all direct current flows into choke coil 716. Thus, second switch 718 is turned off. Also, second compensation circuit 711, as described in the first exemplary embodiment, acts to cancel a parasitic capacitance of second PIN diode 710 in two bands (M1 and M2), the impedance of second switch 718 from the side of common terminal 708 is relatively high in the two bands. Accordingly, in these two bands (M1 and M2), the input signal fed from first terminal 707 may be output to common terminal 708, and may not be output to second terminal 709.

In substantially the same manner, when second switch 718 is turned on by applying a direct current, as first diode 701 substantially prevents the flow of current and first capacitor 703 of first compensation circuit 702 cuts the direct current component, substantially all direct current flows into choke coil 716 Thus, first switch 717 is turned off. Also, as first compensation circuit 702 acts to substantially cancel a parasitic capacitance of first PIN diode 701 in two bands (M1 and M2), the impedance of first switch 717 from the side of common terminal 708 is relatively high in these two bands. Accordingly, in the two bands (M1 and M2), an input signal fed from common terminal 708 may be output to second terminal 709, and may not be output to first terminal 707.

The circuit arrangement of FIG. 5 may enable the realization of a dual band SPDT switch which functions in two bands (M1 and M2) to selectively and separately turn on first switch 717 and second switch 718.

Figure 6A:
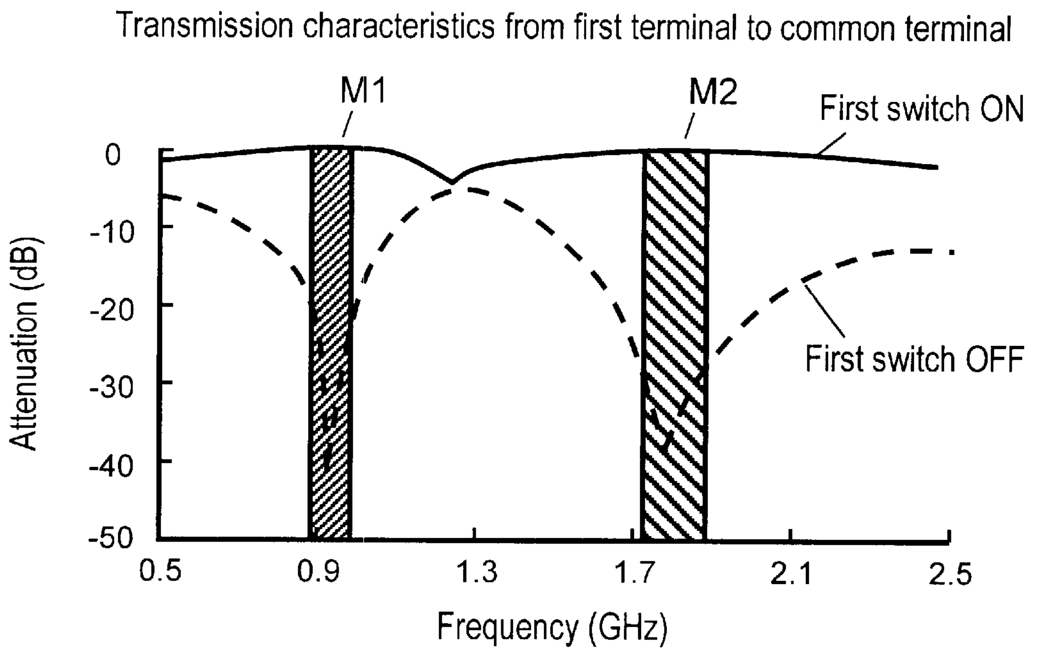
FIGS. 6A and 6B shows transmission characteristics of the dual band switch of FIG. 5.
Figure 6B:
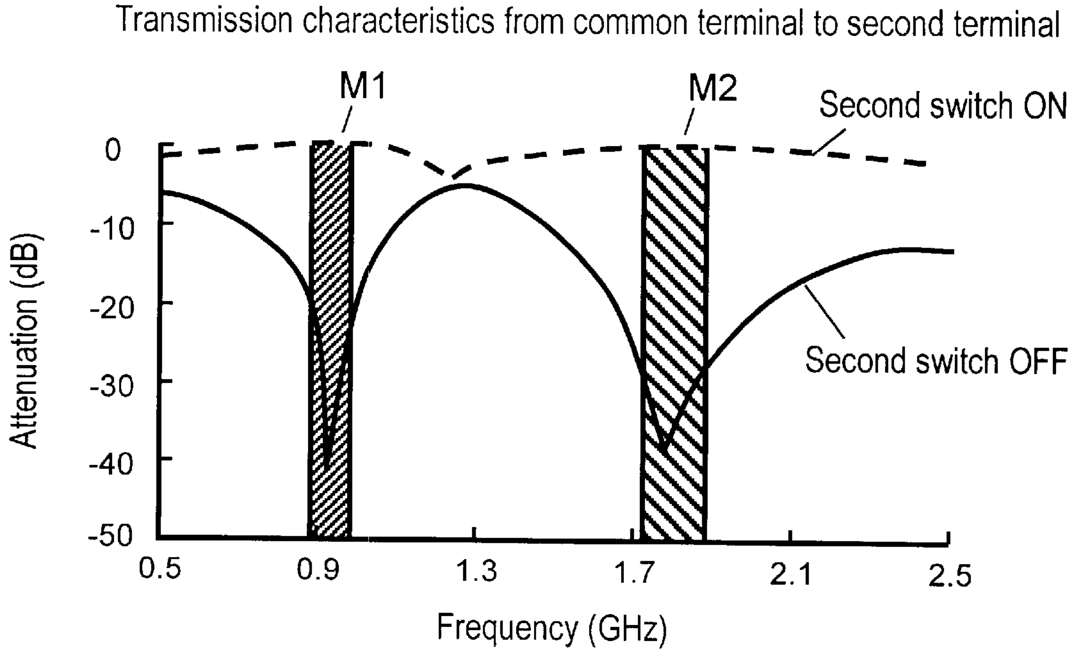

FIGS. 6A and 6B show transmission characteristics of a dual band SPDT switch in accordance with the second exemplary embodiment of the present invention. The transmission characteristics from first terminal 707 to common terminal 708 show that, at an ON state of first switch 717. an insertion loss in first band M1 and second band M2 is less than 0.5 dB further, at an OFF state of first switch 717, an isolation of more than 25 dB may be attained in both bands M1 and M2. The transmission characteristics from common terminal 708 to second terminal 709 show that, at an ON state of second switch 718, an insertion loss is less than 0.5 dB in first band M1 and in second band M2. Further, at an OFF state of second switch 718, an isolation of more than 25 dB may be attained in both bands M1 and M2.

As described above, a relatively good characteristics for a dual band SPDT switch may be attained by making a circuit arranged as in this exemplary embodiment.

In FIG. 5, each of first switch 717 and second switch 718 may be formed with the circuit shown in FIG. 1. Alternatively, these switches may also be formed with the circuit shown in FIG. 4.

In the dual band SPDT switch of FIG. 5, a bias circuit, comprising a resistor, an inductor and a bypass capacitor may be used for each switch for putting the PIN diode into an active state. In addition, a direct current cut capacitor may be used at each terminal for preventing a direct current. The present invention is not, however, restricted by details of the various possible values and the structure of these additional components.

In a portable telephone terminal in which two frequency bands are used for example, the structure of a high frequency switch circuit of the terminal may be simplified by using a dual band switch in accordance with an embodiment of the present invention. The terminal may thus be reduced both in size and weight.

Third Exemplary Embodiment

Figure 7:
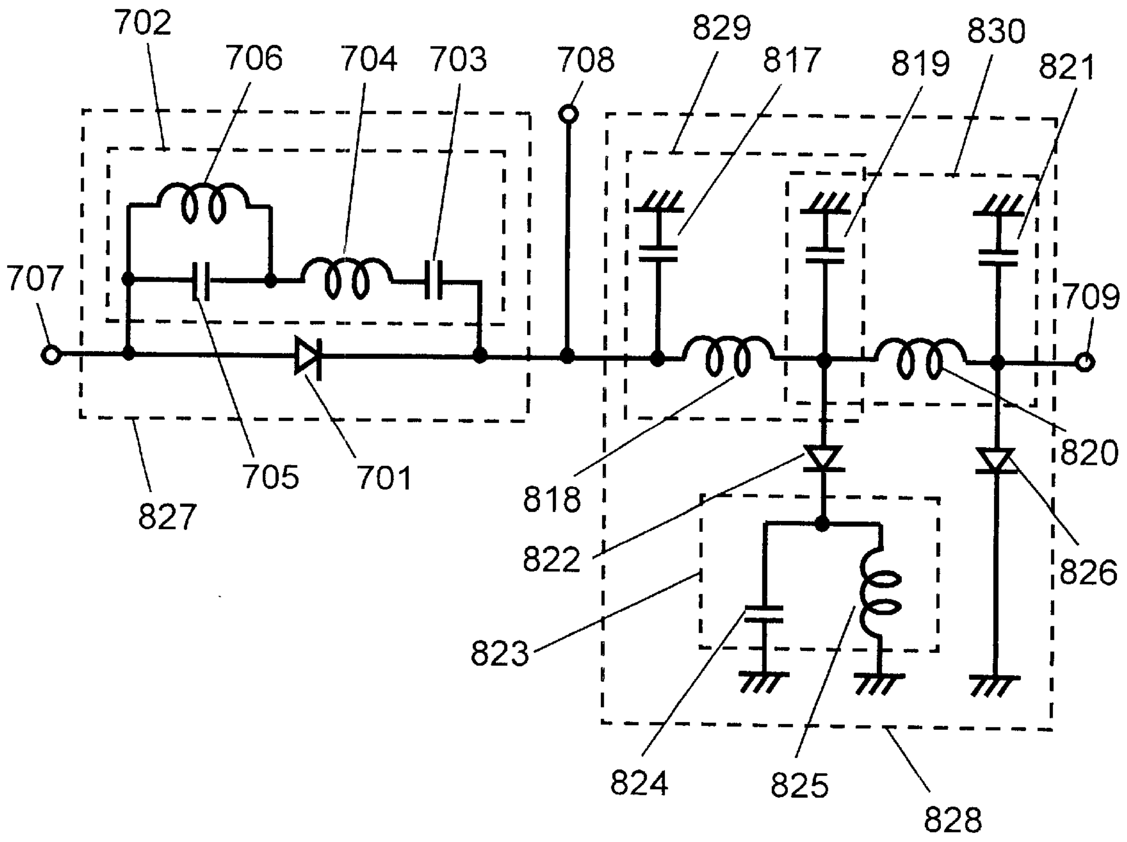
FIG. 7 shows a circuit diagram of a dual band switch in a third exemplary embodiment of the present invention.

FIG. 7 shows a dual band switch in accordance with a third exemplary embodiment of the present invention. In the dual band switches shown in FIG. 7, first switch 827 has the same structure as that of first switch 717 of the second exemplary embodiment. Therefore, the same reference numerals are used and a detailed explanation of the operation of first switch 827 is not repeated.

In FIG. 7, to common terminal 708, one end of first switch 827, one end of third capacitor 817, and one end of a third inductor 818 may be connected to common terminal 708. Another end of the third capacitor 817 may be grounded. To another end of third inductor 818, one end of fourth capacitor 819, one end of fourth inductor 820, and an anode of second PIN diode 822 may be connected. Another end of fourth capacitor 819 may be grounded. Another end of fourth inductor 820 forms second terminal 709, to which one end of fifth capacitor 821 and an anode of third PIN diode 826 are connected. Another end of fifth capacitor 821 may be grounded. To a cathode of second PIN diode 822, one end of compensation circuit 823, which comprises a parallel resonance circuit formed with sixth capacitor 824 and fifth inductor 825, may be connected. Another end of second compensation circuit 823 may be grounded. A cathode of third PIN diode 826 may be grounded. Hence, second switch 828 may be formed between common terminal 708 and second terminal 709.

Third capacitor 817, third inductor 818, and fourth capacitor 819 form first phase shift circuit 829. Fourth capacitor 819, fourth inductor 820, and fifth capacitor 821 form second phase shift circuit 830. For example, the phase of first phase shift circuit 829 may be set to be approximately 90° in a second band (e.g. M2 in the second exemplary embodiment), and a total phase of first phase shift circuit 829 and of second phase shift circuit 830 may be set to be approximately 90° in a first band (e.g. M1 in the second exemplary embodiment).

Second compensation circuit 823 may be set to attain parallel resonance in a first band M1, and to attain series resonance with second PIN diode 822, in an active state, in a second band M2.

The operation of the dual band switch of FIG. 7 is described below.

Figure 8:
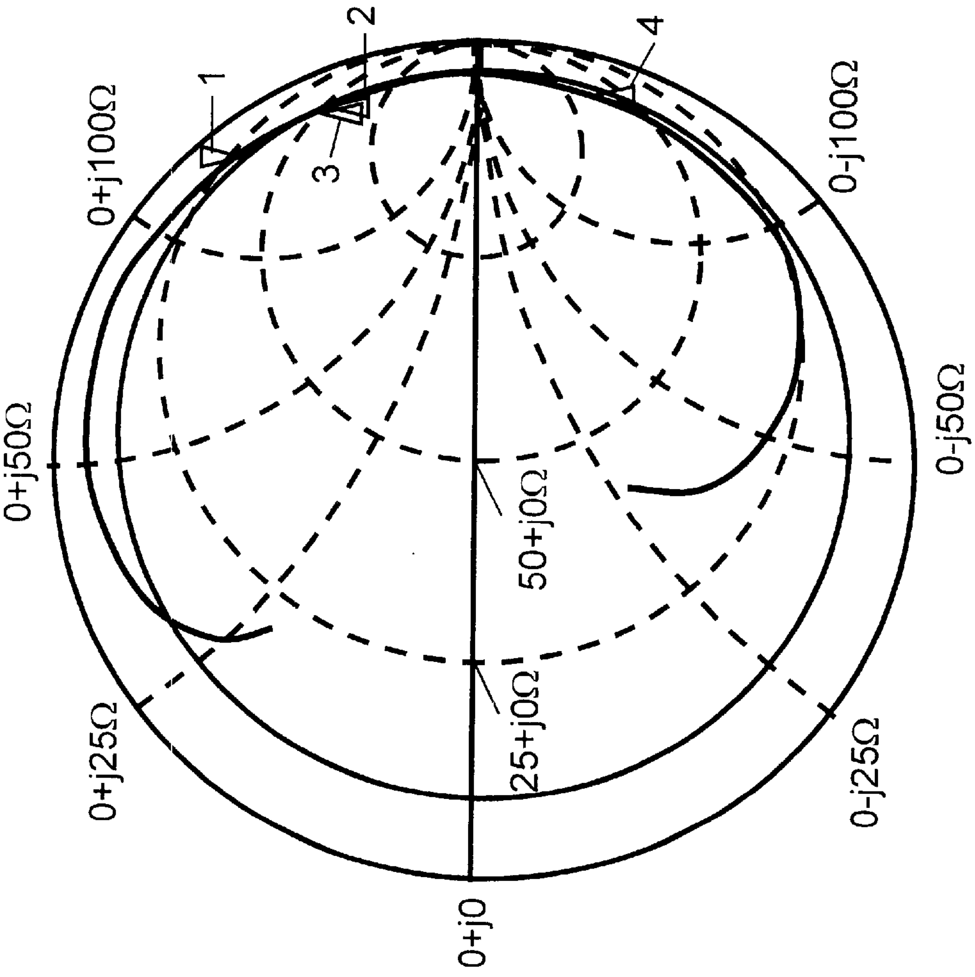
FIG. 8 shows impedance characteristics at an OFF state of a second switch of the dual band switch in accordance with an exemplary embodiment of the present invention.

When a direct current is applied by applying a bias to a forward direction of first PIN diode 701, first switch 827 may be turned on as described in the first exemplary embodiment of the present invention. On the application of a bias to terminal 707 the direct current flows into second PIN diode 822 and to third diode 826, and both diodes become active. Then, in second band M2, second PIN diode 822, in an active state, and second compensation circuit 823 attain a state of series resonance. Furthermore, the phase of first phase shift circuit 829 may change by approximately 90°. Hence, the impedance of second switch 828 becomes relatively high from the side of common terminal 708. On the other hand, in first band M1, as second compensation circuit 823 attains a state of parallel resonance, the effect of second PIN diode 822 becomes negligible with regard to high frequency, and as since a total of the phase of first phase shift circuit 829 and the phase of second phase shift circuit 830 becomes approximately 90°, the impedance of the second switch 828 becomes relatively high from the side of the common terminal 708. FIG. 8 shows an impedance characteristics of switch 828 from the side of common terminal 708 in this situation. In FIG. 8, a region between markers 1 and 2 represents first band M1 (e.g. 890–960 MHz), and a region between markers 3 and 4 represents second band M2 (e.g. 1710–1880 MHz). In these two bands, states of high impedance are obtained, so that it is understood that the signal transmitted from terminal 707 to common terminal 708 is may not be outputted to second terminal 709. Consequently, in both bands M1 and M2, second switch 828 may attain a sufficient OFF state.

Referring to FIG. 7, when a bias is not applied to terminal 707, first switch 827 may be turned off in both first band M1 and second band M2 as described above in the first exemplary embodiment. In this case, the impedance of switch 827 from the side of common terminal 708 becomes high in both bands (M1 and M2). Further, both second PIN diode 822 and third PIN diode 826 may become inactive, and second switch 828 behaves substantially as first phase shift circuit 829 and second phase shift circuit 830. Hence, a signal fed from common terminal 708 is transmitted to second terminal 709 substantially unchanged. In other words, second switch 828 is turned on.

Figure 9A:
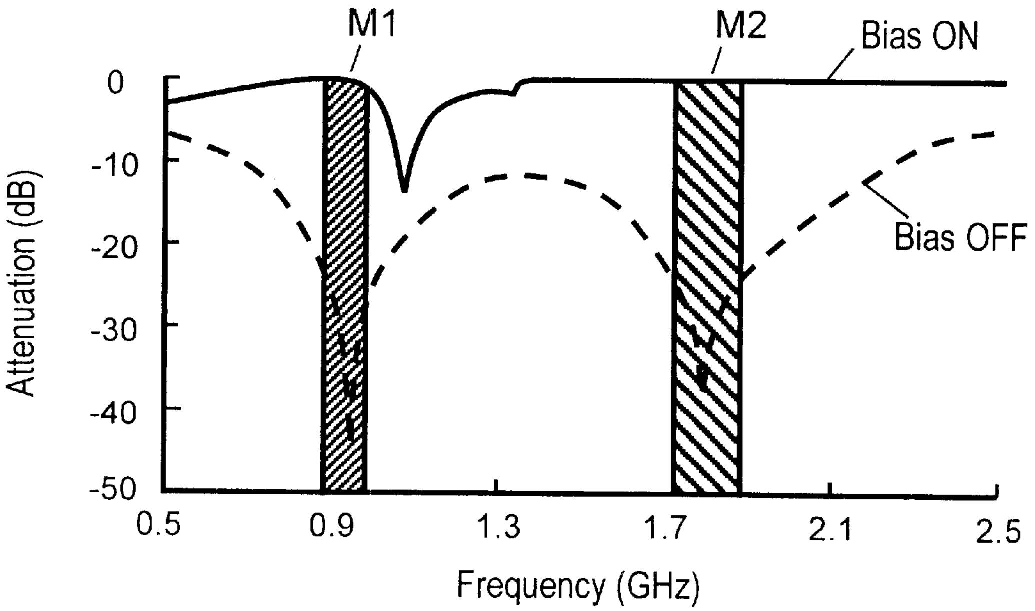
FIGS. 9A–9B show transmission characteristics of the dual band switch in accordance with an exemplary embodiment of the present invention.
Figure 9B:
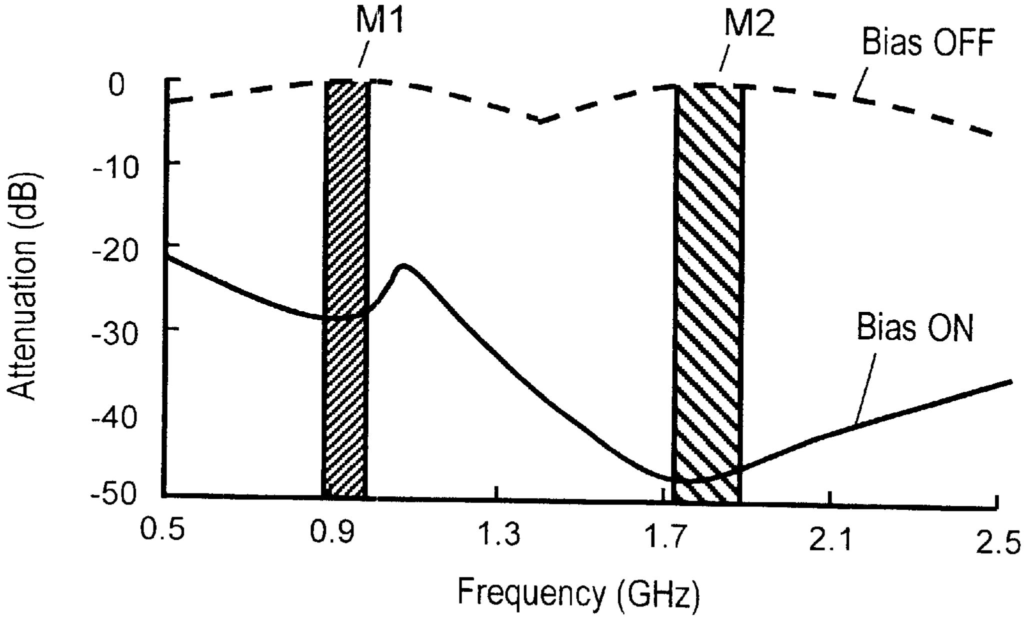

FIGS. 9A–9B shows transmission characteristics of the dual band SPDT switch of this exemplary embodiment. The transmission characteristics from first terminal 707 to common terminal 708 show that when the bias is ON, an insertion loss is less than 0.5 dB in both first band M1 and second band M2, while when the bias is OFF, an isolation of more than 25 dB may be attained both bands M1 and M2. The transmission characteristics from common terminal 708 to second terminal 709 show that when the bias is OFF, an insertion loss in both first band M1 and second band M2 is less than 0.25 dB, while when the bias is ON, an isolation of more than 25 dB may be attained in both bands M1 and M2. The circuit of FIG. 7 thus may enable the realization of a dual band SPDT switch which works in two bands (e.g. M1 and M2,) by putting first PIN diode 701, second PIN diode 822, and e.g. third PIN diode 826 into an active state or an inactive state simultaneously. This dual band SPDT switch works with one bias circuit, and when second switch 828 is turned on, a direct current may not necessarily be applied. Accordingly, such a dual band switch has an advantage of saving the consumption of an electric current.

First switch 827 of FIG. 7 is formed by the circuit shown in FIG. 1. Such a switch, however, may also be formed, for example, by the circuit shown in FIG. 4.

Also, although first phase shift circuit 829 and second phase shift circuit 830 of this exemplary embodiment comprises a capacitor and an inductor which are lumped elements, these phase shift circuits may also be formed with transmission lines which are distributed elements. In the latter case, a truncation of the number of elements may be realized, also a phase shift circuit may be ideally formed.

Additionally, although the cathode of third diode 826 of FIG. 7 is directly grounded, the cathode may also be grounded through a compensation circuit comprising a parallel resonance circuit formed, for example, with a capacitor and an inductor. In this case, in the active state of third PIN diode 826, the connecting point of second phase shift circuit 830 and third PIN diode 826 may be put into a state of sufficient low impedance.

In a dual band SPDT switch as in this exemplary embodiment, a bias circuit comprising a resistor, an inductor and a bypass capacitor, may be useful for putting a PIN diode into an ON state. Further, a direct current cut capacitor may be useful at each terminal for preventing a direct current. The present invention is not, however, restricted by the details of the various possible values and the structure of these additional components.

In a portable telephone terminal, for example, in which two frequency bands are used, the structure of a high frequency switch circuit of the terminal may be simplified by using a dual band switch in accordance with an embodiment of the present invention. The terminal may thus be reduced both in size and weight.

Fourth Exemplary Embodiment

Figure 10:
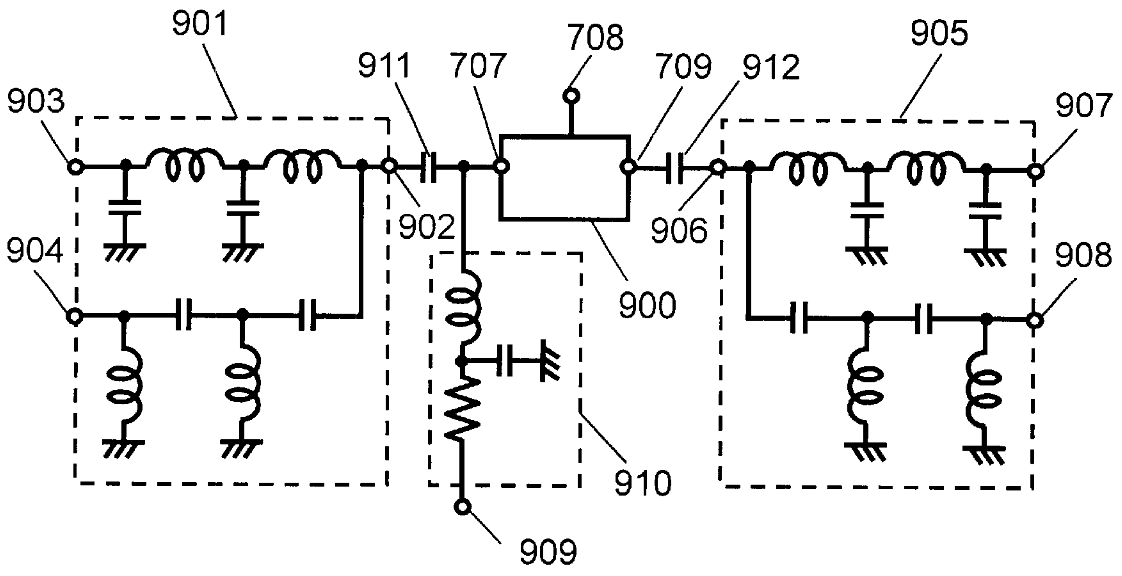
FIG. 10 shows a circuit diagram of a dual band antenna duplexer in a fourth exemplary embodiment of the present invention.

FIG. 10 shows a dual band antenna duplexer of a fourth exemplary embodiment of the present invention. Dual band switch 900, shown in FIG. 10, of the dual band antenna duplexer of the fourth exemplary embodiment of the present invention may have the same structure as the circuit shown in FIG. 7 in accordance with the third exemplary embodiment of the present invention. Therefore, the circuit diagram and detailed explanation of the switch are omitted.

In the dual band antenna duplexer of FIG. 10, output terminal 902 of combiner 901 may be connected through direct current cut capacitor 911 to first terminal 707 of dual band switch 900, and, input terminal 906 of second divider 905 may be connected through direct current cut capacitor 912 to second terminal 709. Furthermore, control terminal 909 for feeding a control signal to dual band switch 900 and bias circuit 910 are provided for forming a dual band antenna duplexer. Combiner 901 may function to transmit a sending signal, in a first band M1, fed from first sending side terminal 903 to output terminal 902. Combiner 901 may also function to transmit a sending signal, in a second band M2, fed from second sending side terminal 904 to output terminal 902. Divider 905 may function to transmit a receiving signal, in first band M1, fed from input terminal 906 to first receiving side terminal 907. Separation circuit 905 may also function to transmit a receiving signal, in second band M2, fed from input terminal 906 to receiving side terminal 908.

In combiner 901, the route from first sending side terminal 903 to output terminal 902 may be formed by a ladder type low-pass filter comprising, for example, four elements for passing signals falling within first band M1 and for stopping signals falling within second band M2. The route from second sending side terminal 904 to output terminal 902 may be formed with a ladder type high-pass filter comprising, for example, four elements for stopping signals falling within first band M1 and passing signals falling within second band M2. With this arrangement, a sending signal, in first band M1, fed from firs t sending side terminal 903 may be transmitted to output terminal 902 substantially without leaking to second sending side terminal 904, while a sending signal, in second band M2, fed from second sending side terminal 904 may be transmitted to output terminal 902 substantially without leaking to first sending side terminal 903.

For divider 905, the same circuit as that of combiner 901 may be used. Accordingly, a receiving signal fed from input terminal 906 may be propagates such that a component in first band M1 may be transmitted to first receiving side terminal 907 and a component in second band M2 may be transmitted to the second output side terminal 908; and each component may not leak into the other.

The operation of a dual band antenna duplexer having the circuit arrangement discussed above is described below.

When sending a signal, a bias may be applied to control terminal 909 for putting into an ON state a switch connecting between first terminal 707 and common terminal 708 of dual band switch 900. A sending signal in first band M1 may then be fed from first sending side terminal 903 through combiner 901 and via first terminal 707 of dual band switch 900 to common terminal 708.In addition, a sending signal in second band M2 may be fed from second sending side terminal 904 through combiner 901 and via first terminal 707 of dual band switch 900 to common terminal 708 (common terminal 708 may typically be connected to an antenna of a communication apparatus). Note that a sending signal in each band may not leak to another sending side terminal due to the function of combiner 901. Also, the signals may not leak to first receiving side terminal 907 and to second receiving side terminal 908 due to the function of dual band switch 900. Next, when receiving a signal, a bias of a control terminal 909 is canceled for putting into an ON state a switch connecting between common terminal 708 and second terminal 709 of dual band switch 900A receiving signal may then be fed from common terminal 708 through second terminal 709 of the dual band switch 900 further due to divider 905, the signal may be transmitted such that that a signal component in first band M1 may be outputted to first receiving side terminal 907, and a signal component in second band M2 may be outputted to second receiving side terminal 908. Note that a receiving signal in each band may not leak to another receiving side terminal due to the function of divider 905. Also, the signals may not leak to first sending side terminal 903 and to second sending side terminal 904 due to the function of dual band switch 900.

Figure 11A:
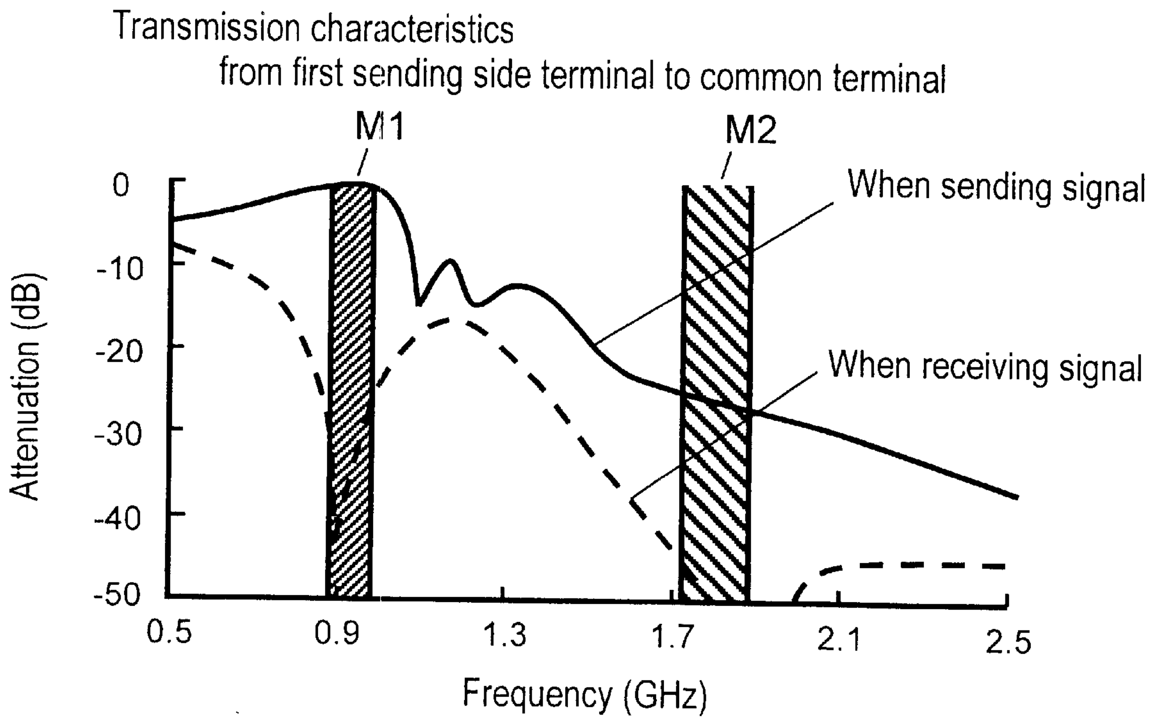
FIGS. 11A and 11B show transmission characteristics of the sending side of the dual band antenna duplexer of FIG. 10, FIGS. 12A and 12B show transmission characteristics of the receiving side of the dual band antenna duplexer of FIG. 10.
Figure 11B:
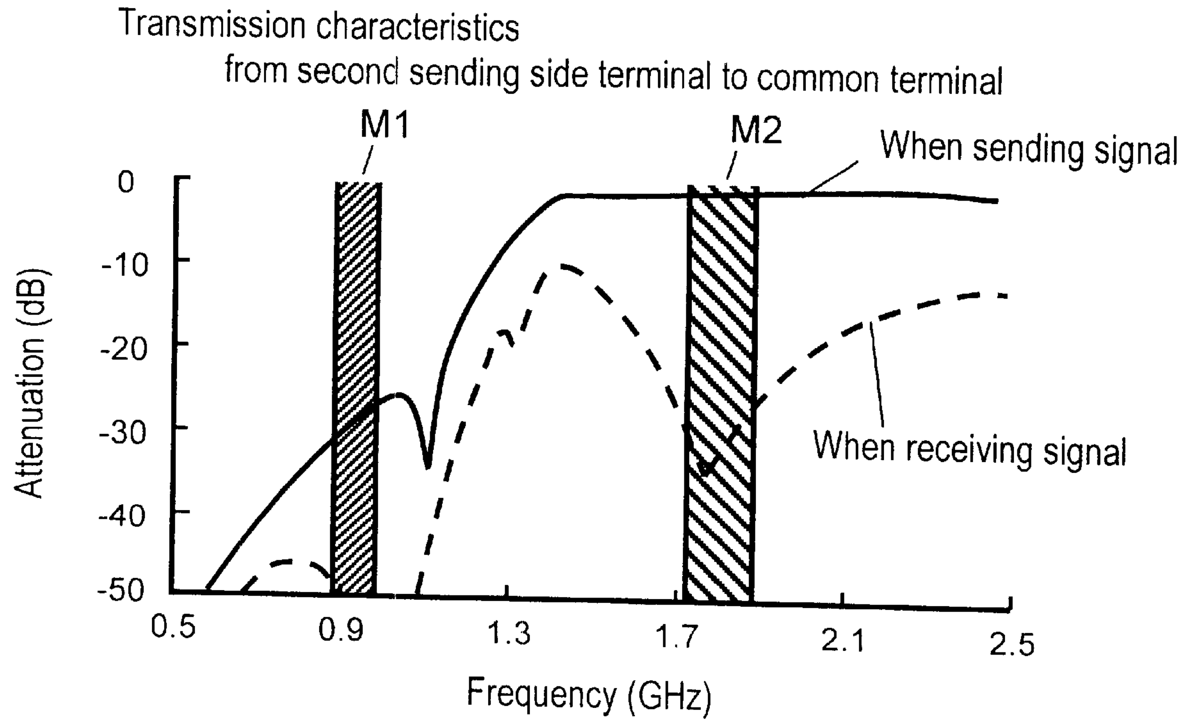
Figure 12A:
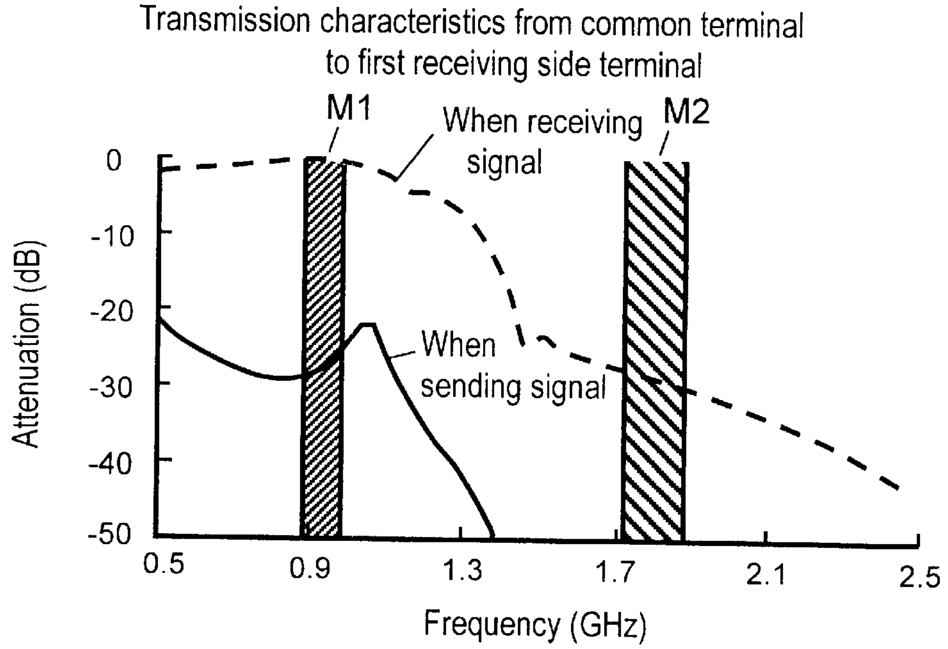
Figure 12B:
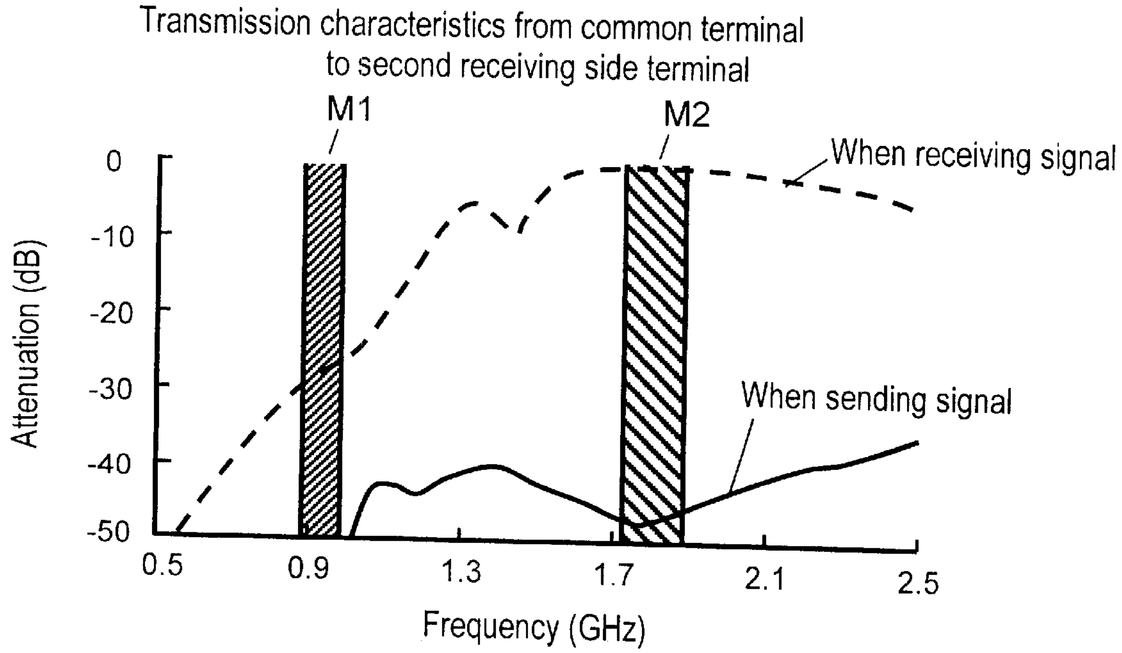
Figure 13:
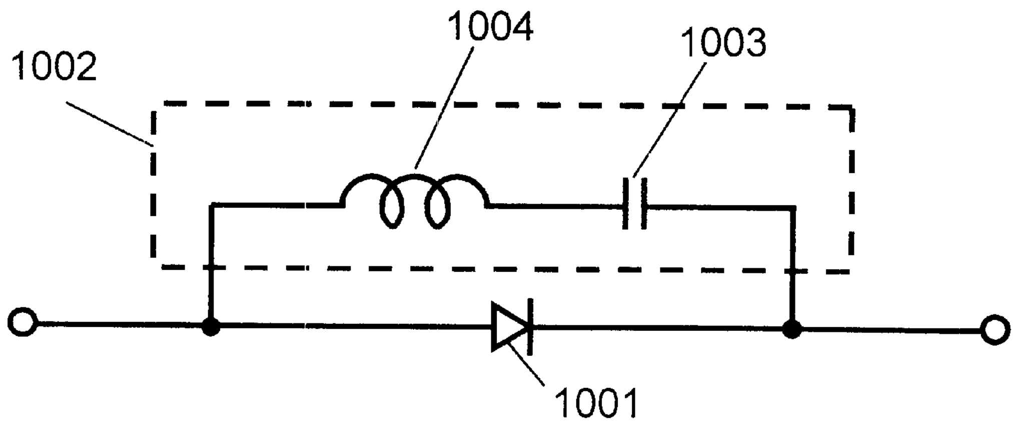
FIG. 13 Prior Art
FIG. 13 shows a circuit diagram of a conventional dual band switch.

FIGS. 11A and 11B and FIGS. 12A and 12B show passing characteristics of the dual band antenna duplexer. First band M1 may be set to, for example, 890–960 MHz, and second band M2 may be set to, for example, 1710–1880 MHz. As shown in FIG. 11A, the transmission characteristics from first sending side terminal 903 to common terminal 708 are such that, when sending a signal, an insertion loss in first band M1 may be less than 1 dB, and an attenuation of more than 25 dB may be attained in second band M2, whereby a sending signal in first band M1 may be transmitted to the common terminal 708. Also, when receiving a signal, an isolation of more than 25 dB may be attained in both bands. The transmission characteristics from second sending side terminal 904 to common terminal 708 are such that, as shown in FIG. 11B, when sending a signal, the attenuation in first band M1 may be more than 25 dB, and insertion loss in second band M2 may be less than 1 dB, whereby a sending signal in second band M2 may be transmitted to common terminal 708. When receiving a signal, an isolation of more than 25 dB may be attained in both bands. Next, the transmission characteristics from common terminal 708 to first receiving side terminal 907 are such that, as shown in FIG. 12A, when receiving a signal, an insertion loss in first band M1 may be less than 1 dB, and attenuation in second band M2 may be more than 25 dB, whereby a receiving signal, in first band M1, fed from the common signal 708 may be transmitted to first receiving side terminal 907. Also, when sending signal, an isolation of more than 25 dB may be attained in both bands. Lastly, the transmission characteristics from common terminal 708 to second receiving side terminal 908 are such that, as shown in FIG. 12B, when receiving a signal, attenuation in first band M1 may be more than 25 dB, and an insertion loss in second band M2 may be less than 1 dB, whereby a receiving signal, in second band M2, fed from the common terminal 708 may be transmitted to second receiving side terminal 908. Also, when sending a signal, an isolation of more than 25 may be attained in both bands. As described above, the dual band antenna duplexer according to an embodiment of the present invention has characteristics suitable for a multiple system type portable communication terminal in which a first band M1 and a second band M2 are used.

In the circuit of FIG. 10, both combiner 901 and divider 905 are respectively formed by a composite circuit of low-pass filters and high-pass filters. For eliminating unwanted frequency components, however, the composite circuits may be partly or wholly formed with band-pass filters. For instance, at the sending side, in many cases, higher harmonic may cause a problem, however, the high-pass filter may not eliminate such a problem. Therefore, a combiner may be formed as a band-pass filter. On the other hand, at the receiving side, as it may be necessary to eliminate a local frequency, an image frequency, and the like, generated at the time of frequency conversion besides the higher harmonic, a divider may be formed with a composite circuit comprising band-pass filters. These filters may serve to help eliminate unwanted waves in high and low bands of signal components.

In addition, in the circuit of FIG. 10, the arrangement of the third exemplary embodiment of the present invention may be used for dual band switch 900. The structure of the second exemplary embodiment of the present invention, however, may also be used. In this case, two control terminals and two bias circuits may be respectively provided, and a bias may always be applied to one of these. Therefore, the consumption of electric current may become relatively large. As the number of PIN diodes used is two, the circuit may be formed with a simple arrangement.

In a portable telephone terminal in which two frequency bands are used, for example, the circuit of an antenna duplexer of the terminal may be formed with a simple arrangement structure by using the dual band antenna duplexer in accordance with an embodiment of the present invention. The terminal may be thus reduced in size and weight.

INDUSTRIAL APPLICABILITY

As described above, a dual band switch in accordance with an embodiment of the present invention comprises a circuit connecting a diode and a compensation circuit in parallel. The compensation circuit may be formed with a circuit having two series resonance points and one parallel resonance point. The aforementioned arrangement allows the impedance of compensation circuit, which is capacitive at low frequency close to a direct current, to become inductive after a first series resonance point, whereby a parasitic capacitance of a diode may be canceled in a first band. Further the aforementioned arrangement may also allow the impedance of a compensation circuit to become inductive again after a parallel resonance point and a following series resonance point, whereby a parasitic capacitance of a PIN diode is canceled in a second band. A dual band switch which may assure a sufficient OFF state in two different bands may be provided with one PIN diode. Hence, switch with reduced size and weight may be realized.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A dual band switch comprising:

a parallel circuit including
- i) a diode; and
- ii) a compensation circuit for said diode, said compensation circuit having at least two series resonance points and a parallel resonance point, wherein said compensation circuit comprises a series circuit including a) a series resonance circuit including at least two elements and b) a parallel resonance circuit including at least two elements.

2. The dual band switch according to claim 1 further comprising:

a first terminal;

a second terminal;

a common terminal;

a further parallel circuit including
- i) a further diode; and
- ii) a further compensation circuit for said further diode, said further compensation circuit having at least two series resonance points and a parallel resonance point, wherein said further compensation circuit comprises a further series circuit including a) a further series resonance circuit and b) a further parallel resonance circuit, said further diode and said further compensation circuit are coupled between said second terminal and said common terminal, and said diode and said compensation circuit are coupled between said first terminal and said common terminal.

3. The dual band switch according to claim 2, wherein said dual band switch is included in a dual band antenna of a duplexer which further comprises:

a combiner having a first sending side terminal, a second sending side terminal, and an output terminal; and a divider having a first receiving side terminal, a second receiving side terminal, and an input terminal, wherein said output terminal of said combiner is coupled to said first terminal of said dual band switch, and said input terminal of said divider is coupled to said second terminal of said dual band switch.

4. The dual band switch according to claim 3, wherein said combiner includes a low-pass filter which is coupled between said first sending side terminal and said output terminal, and a high-pass filter which is coupled between said second sending side terminal and said output terminal.

5. The dual band switch according to claim 3, wherein said combiner includes a low-pass filter which is coupled between said first sending side terminal and said output terminal, and a band-pass filter which is coupled between said second sending side terminal and said output terminal.

6. The dual band switch according to claim 3, wherein said divider includes a low-pass filter which is coupled between said input terminal and said first receiving side terminal, and a high-pass filter which is coupled between said input terminal and said second receiving side terminal.

7. The dual band switch according to claim 2, wherein said divider includes a band-pass filter which is coupled between said input terminal and said first receiving side terminal, and a band-pass filter which is coupled between said input terminal and said second receiving side terminal.

8. The dual band switch according to claim 2, wherein said further compensation circuit comprises a parallel circuit including i) a first series resonance circuit and ii) a second series resonance circuit.

9. The dual band switch according to claim 1, further comprising:

a first terminal;

a second terminal;

a common terminal;

said parallel circuit including said diode coupled between said first terminal and said common terminal, a first series circuit including a first phase shift circuit and a second phase shift circuit, said first phase shift circuit is coupled between said common terminal and a middle node, and said second phase shift circuit is coupled between said middle node and said second terminal;

a second series circuit including a further diode and a further compensation circuit, said series circuit coupled between said middle node and a ground terminal; and a third diode coupled between said second terminal and said ground terminal.

10. The dual band switch according claim 9, wherein said further compensation circuit has at least one parallel resonance point.

11. The dual band switch according to claim 9, wherein at a frequency at which a phase of said first phase shift circuit becomes substantially 90°, a parasitic inductance of said second diode in an active state and said second compensation circuit attains a series resonance.

12. The dual band switch according to claim 9, wherein, at a frequency at which a total of a phase of said first phase shift circuit and a phase of said second phase shift circuit becomes substantially 90°, said second compensation circuit attains a parallel resonance.

13. The dual band switch according to claim 1, wherein said dual band switch is included in a dual band mobile communication apparatus as a high frequency circuit for said dual band mobile communication apparatus.

14. A dual band switch comprising:

a parallel circuit including i) a diode; and ii) a compensation circuit for said diode, said compensation circuit having at least two series resonance points and a parallel resonance point, wherein said compensation circuit comprises a series circuit including a) a series resonance circuit, said series resonance circuit including a capacitor and an inductor connected in series, and b) a parallel resonance circuit, said parallel resonance circuit including a capacitor and an inductor connected in parallel.

* * * * *

UNITED STATES PATENT AND TRADEMARK OFFICE

CERTIFICATE OF CORRECTION

PATENT NO. : 6,496,083 B1 
DATED : December 17, 2002
INVENTOR(S) : Kushitani et al.

It is certified that error appears in the above-identified patent and that said Letters Patent is hereby corrected as shown below:

<u>Column 11,</u>
Line 18, "claim 2" should read -- claim 3 --.

Signed and Sealed this

Nineteenth Day of August, 2003

JAMES E. ROGAN
*Director of the United States Patent and Trademark Office*